(12) United States Patent
Lee et al.

(10) Patent No.: US 7,919,787 B2
(45) Date of Patent: *Apr. 5, 2011

(54) SEMICONDUCTOR DEVICE WITH A LIGHT EMITTING SEMICONDUCTOR DIE

(75) Inventors: Kong Weng Lee, San Jose, CA (US); Kee Yean Ng, Penang (MY); Yew Cheong Kuan, Penang (MY); Cheng Why Tan, Penang (MY); Gin Ghee Tan, Penang (MY)

(73) Assignee: Avago Technologies ECBU IP (Singapore) Pte. Ltd. (SG)

( * ) Notice: Subject to any disclaimer, the term of this patent is extended or adjusted under 35 U.S.C. 154(b) by 494 days.

This patent is subject to a terminal disclaimer.

(21) Appl. No.: 11/838,301

(22) Filed: Aug. 14, 2007

(65) Prior Publication Data

US 2007/0272940 A1 Nov. 29, 2007

Related U.S. Application Data

(63) Continuation-in-part of application No. 10/608,605, filed on Jun. 27, 2003, now Pat. No. 7,256,486.

(51) Int. Cl.
*H01L 33/00* (2010.01)
*H01L 23/48* (2010.01)

(52) U.S. Cl. ............... 257/99; 257/778; 257/E33.056; 257/E33.062; 257/E33.065; 257/E33.066

(58) Field of Classification Search .......... 257/99, 257/778, E33.056, E33.062, E33.065, E33.066
See application file for complete search history.

(56) References Cited

U.S. PATENT DOCUMENTS

| 2,907,925 | A | | 10/1959 | Parsons | |
|---|---|---|---|---|---|
| 4,843,280 | A | * | 6/1989 | Lumbard et al. | 313/500 |
| 5,006,673 | A | | 4/1991 | Freyman et al. | |
| 5,177,593 | A | | 1/1993 | Abe | |
| 5,298,687 | A | | 3/1994 | Rapoport et al. | |
| 5,440,075 | A | | 8/1995 | Kawakita et al. | |
| 5,640,048 | A | | 6/1997 | Selna | |
| 5,670,797 | A | | 9/1997 | Okazaki | |
| 5,986,885 | A | | 11/1999 | Wyland | |
| 6,084,295 | A | | 7/2000 | Horiuchi et al. | |
| 6,191,477 | B1 | | 2/2001 | Hashemi | |
| 6,242,280 | B1 | * | 6/2001 | Koay et al. | 438/106 |
| 6,262,513 | B1 | * | 7/2001 | Furukawa et al. | 310/313 R |
| 6,268,654 | B1 | | 7/2001 | Glenn et al. | |
| 6,362,525 | B1 | | 3/2002 | Rahim | |
| 6,383,835 | B1 | | 5/2002 | Hata et al. | |
| 6,392,294 | B1 | * | 5/2002 | Yamaguchi | 257/690 |
| 6,620,720 | B1 | | 9/2003 | Moyer et al. | |

(Continued)

OTHER PUBLICATIONS

Syd R. Wilson, Clarence J. Tracy, and John L. Freeman, Jr., "Handbook of Multilevel Metallization for Integrated Circuits," Noyes Publ., Westwood, New Jersey (1993), pp. 868-872.

(Continued)

*Primary Examiner* — Shouxiang Hu

(57) ABSTRACT

A semiconductor device includes a light emitting semiconductor die mounted on at least one of first and second electrically conductive bonding pads, which are located on a first major surface of a substrate of the device. The light emitting semiconductor die has an anode and a cathode, which are electrically connected to the first and second electrically conductive bonding pads. The semiconductor device further includes first and second electrically conductive connecting pads, which are located on a second major surface of the substrate. The first and second electrically conductive bonding pads are electrically connected to the first and second electrically conductive connecting pads via first and second electrically conductive interconnecting elements.

14 Claims, 10 Drawing Sheets

U.S. PATENT DOCUMENTS

| | | |
|---|---|---|
| 6,707,247 B2 | 3/2004 | Murano |
| 6,828,510 B1 | 12/2004 | Asai et al. |
| 7,098,593 B2 | 8/2006 | Teng |
| 7,256,486 B2 * | 8/2007 | Lee et al. .................. 257/690 |
| 2002/0139990 A1 | 10/2002 | Suehiro et al. |
| 2002/0179335 A1 | 12/2002 | Curcio et al. |
| 2003/0017645 A1 | 1/2003 | Kabayashi et al. |
| 2003/0020126 A1 | 1/2003 | Sakamoto et al. |
| 2003/0040138 A1 | 2/2003 | Kabayashi et al. |
| 2003/0168256 A1 | 9/2003 | Chien |
| 2004/0222433 A1 * | 11/2004 | Mazzochette et al. .......... 257/99 |

OTHER PUBLICATIONS

Electronic Packaging and Production, "Innovative PCB Reinforcement," (Feb. 1997), p. 1.

Johannes Adam, "New Correlations Between Electrical Current and Temperature Rise in PCB Traces," Proc. 20th IEEE Semi-Therm Symp., (Mar. 2004), pp. 1-8.

* cited by examiner

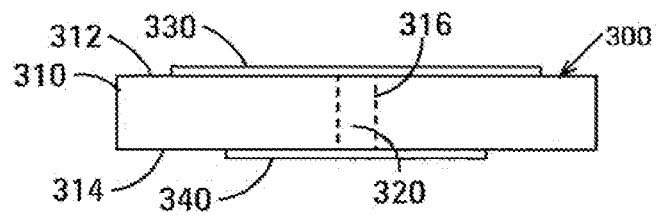
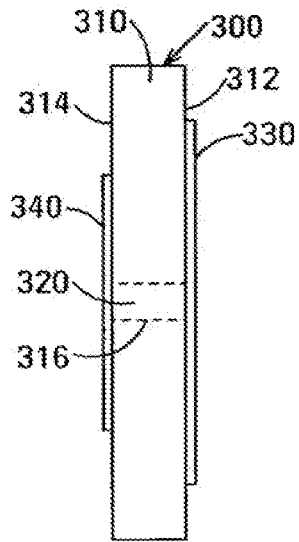
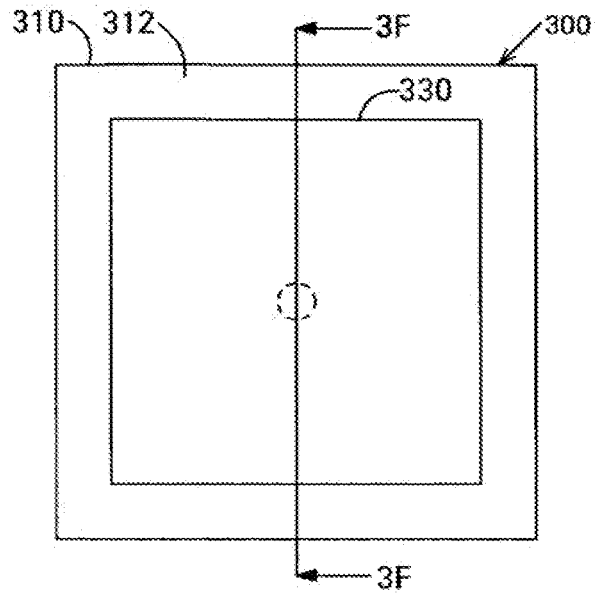
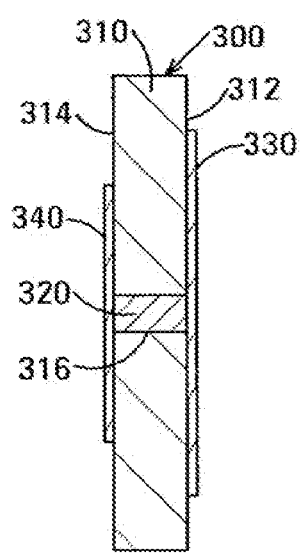
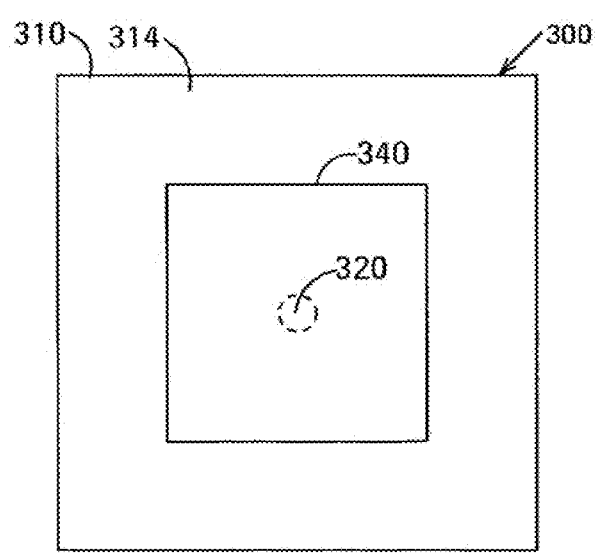
FIG.3B
FIG.3C
FIG.3D
FIG.3F
FIG.3E

SEMICONDUCTOR DEVICE WITH A LIGHT EMITTING SEMICONDUCTOR DIE

RELATED APPLICATION

This application is a continuation-in-part of U.S. patent application Ser. No. 10/608,605, filed Jun. 27, 2003 now U.S. Pat. No. 7,256,486, which is related to U.S. patent application Ser. No. 10/608,606, filed Jun. 27, 2003. Both disclosures are specifically incorporated herein by reference.

BACKGROUND OF THE INVENTION

Many types of conventional semiconductor device are composed of a semiconductor die mounted in a packaging device. One type of packaging device widely used in the industry includes a metal lead frame. A metallization layer of aluminum located on the bottom surface of the semiconductor die is bonded to a conductive surface that forms part of the lead frame to attach and electrically connect the die to the lead frame. Additionally, electrical connections are made between bonding pads on the top surface of the die and other leads of the lead frame to provide additional electrical connections to the die. The lead frame and semiconductor die are then encapsulated to complete the semiconductor device. The packaging device protects the semiconductor die and provides electrical and mechanical connections to the die that are compatible with conventional printed circuit board assembly processes.

In such conventional semiconductor devices, the bottom surface of the die is typically bonded to the conductive surface of the lead frame using a silver epoxy adhesive that cures at a relatively low temperature, typically about 120° C. The curing temperature of the silver epoxy adhesive is compatible with the other materials of the packaging device.

The volume of the packaging device used in such conventional semiconductor devices, i.e., the lead frame and the encapsulant, is typically many times that of the semiconductor die. This makes such conventional semiconductor devices unsuitable for use in applications in which a high packing density is required. A high packing density allows miniaturization and other benefits. Therefore, what is needed is a semiconductor packaging device that is comparable in volume with the semiconductor die and that is compatible with conventional printed circuit board assembly processes.

Recently, semiconductor die having a substrate surface metallization layer of a gold-tin alloy (80% Au:20% Sn approximately) have been introduced in light-emitting devices. Such semiconductor die typically have a substrate of sapphire, silicon carbide or a Group III-V semiconductor material, such as gallium arsenide. Semiconductor devices having substrates of the first two substrate materials have layers of Group III-V semiconductor materials, such as gallium nitride, deposited on their substrates. The die attach process for such semiconductor die uses a gold-tin eutectic, which has a melting point of about 280° C. Temperatures as high as about 350° C. can be encountered in the die attach process for such die. Such high temperatures are incompatible with the materials of many conventional packaging devices. Thus, what is also needed is a packaging device for semiconductor die that use a high-temperature die attach process.

Many printed circuit assembly processes and assembly equipment require the use of standard semiconductor device packages. Modifying such processes to use a new semiconductor device package can be expensive and can interrupt production. Therefore, what is additionally needed is a way to mount a semiconductor die that requires a high-temperature die attach process in a conventional packaging device.

SUMMARY OF THE INVENTION

A semiconductor device includes a light emitting semiconductor die mounted on at least one of first and second electrically conductive bonding pads, which are located on a first major surface of a substrate of the device. The light emitting semiconductor die has an anode and a cathode, which are electrically connected to the first and second electrically conductive bonding pads. The semiconductor device further includes first and second electrically conductive connecting pads, which are located on a second major surface of the substrate. The first and second electrically conductive bonding pads are electrically connected to the first and second electrically conductive connecting pads via first and second electrically conductive interconnecting elements.

A semiconductor device in accordance with an embodiment of the invention includes a substantially planar substrate, first and second electrically conductive bonding pads, a light emitting semiconductor die, first and second electrically conductive connecting pads, and first and second electrically conductive interconnecting elements. The substantially planar substrate has first and second major surfaces. The first and second major surfaces are opposed surfaces. The first and second electrically conductive bonding pads are located on the first major surface. The light emitting semiconductor die has at least one of an anode and a cathode on a bottom major surface of the light emitting semiconductor die. The anode and the cathode of the light emitting semiconductor die are electrically connected to the first and second electrically conductive bonding pads. The semiconductor light emitting die is mounted on at least the first electrically conductive bonding pad such that one of the anode and the cathode on the bottom major surface of the light emitting semiconductor die is electrically connected to the first electrically conductive bonding pad. The first and second electrically conductive connecting pads are located on the second major surface. The first electrically conductive interconnecting element is electrically connected to the first electrically conductive bonding pad and the first electrically conductive connecting pad. The second electrically conductive interconnecting element is electrically connected to the second electrically conductive bonding pad and the second electrically conductive connecting pad. In an embodiment, at least one of the first and second electrically conductive interconnecting elements is located on at least one sidewall of the substantially planar substrate.

A semiconductor device in accordance with another embodiment of the invention includes a substantially planar substrate, first and second electrically conductive bonding pads, a light emitting semiconductor die, first and second electrically conductive connecting pads, and first and second electrically conductive interconnecting elements. The substantially planar substrate has first and second major surfaces. The first and second major surfaces are opposed surfaces. The first and second electrically conductive bonding pads are located on the first major surface. The light emitting semiconductor die has an anode and a cathode on a bottom major surface of the light emitting semiconductor die. The semiconductor light emitting die is mounted on the first and second electrically conductive bonding pads such that the anode of the light emitting semiconductor die is electrically connected to the first electrically conductive bonding pad and the cathode of the light emitting semiconductor die is electrically connected to the second electrically conductive bonding pad. The first and second electrically conductive connecting pads are located on the second major surface. The first electrically conductive interconnecting element is electrically connected to the first electrically conductive bonding pad and the first electrically conductive connecting pad. The second electrically conductive interconnecting element is electrically connected to the second electrically conductive bonding pad and the second electrically conductive connecting pad Other aspects and advantages of the present invention will become apparent from the following detailed description, taken in conjunction with the accompanying drawings, illustrated by way of example of the principles of the invention.

BRIEF DESCRIPTION OF THE DRAWINGS

FIGS. 3A, 3B, 3C, 3D, 3E and 3F are respectively an isometric view, a side view, a front view, a top view, a bottom view and a cross-sectional view of a second embodiment of a packaging device in accordance with the invention. The cross-sectional view of FIG. 3F is along the section line 3F-3F in FIG. 3D.

DETAILED DESCRIPTION

Figure 1A:
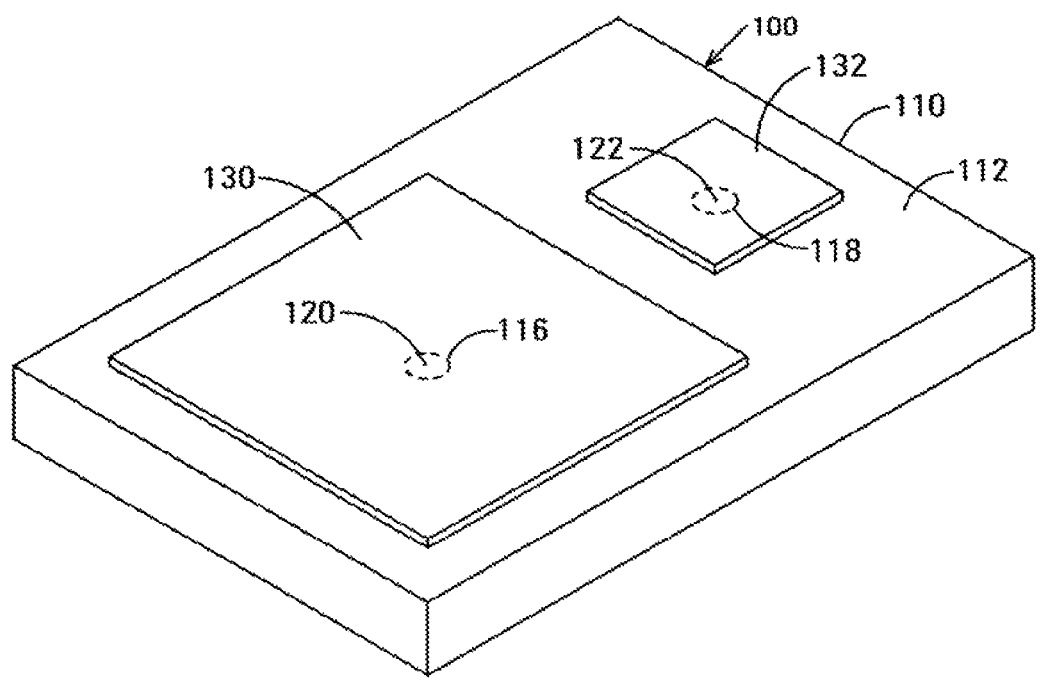
FIGS. 1A, 1B, 1C, 1D, 1E and 1F are respectively an isometric view, a side view, a front view, a top view, a bottom view and a cross-sectional view of a first embodiment of a packaging device in accordance with the invention. The cross-sectional view of FIG. 1F is along the section line 1F-1F in FIG. 1D.
Figure 2A:
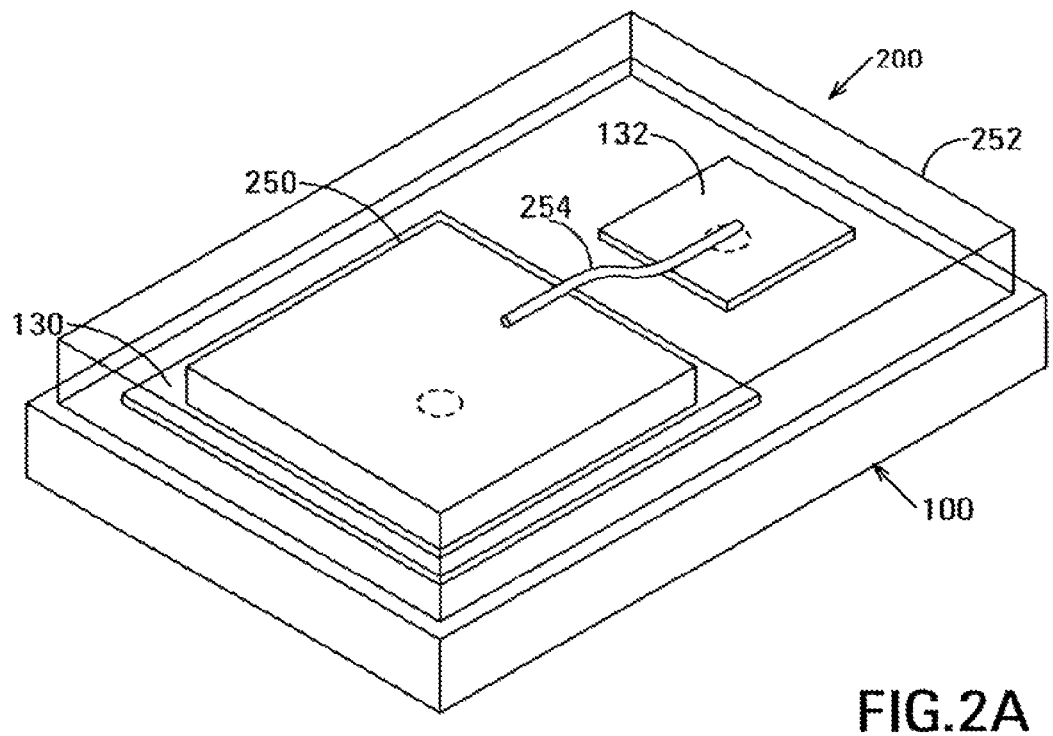
FIGS. 2A, 2B, 2C, 2D, 2E and 2F are respectively an isometric view, a side view, a front view, a top view, a bottom view and a cross-sectional view of a first embodiment of a semiconductor device in accordance with the invention. The cross-sectional view of FIG. 2F is along the section line 2F-2F in FIG. 2D.
Figure 1B:
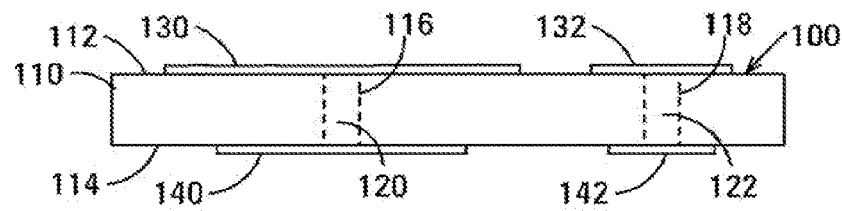
Figure 1C:
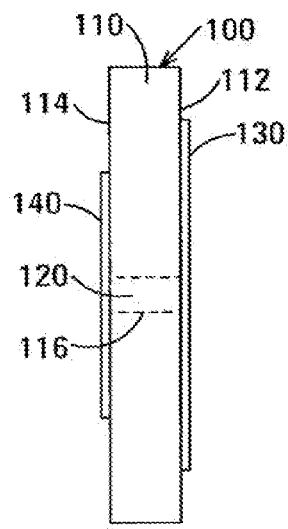
Figure 1D:
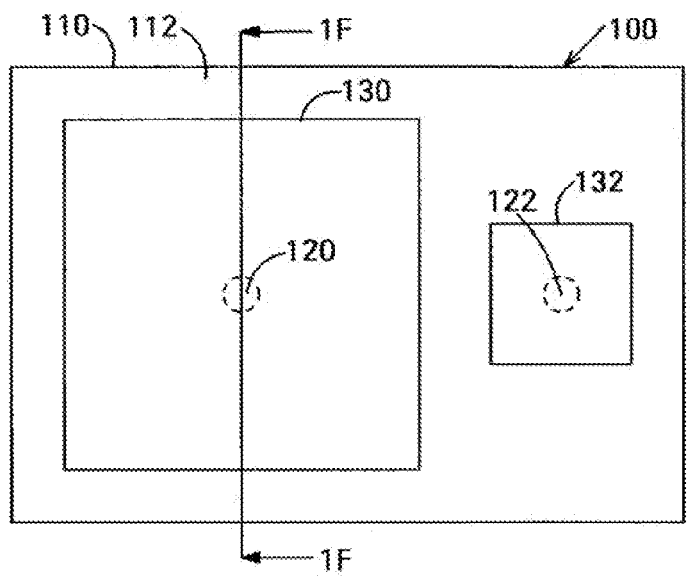
Figure 1F:
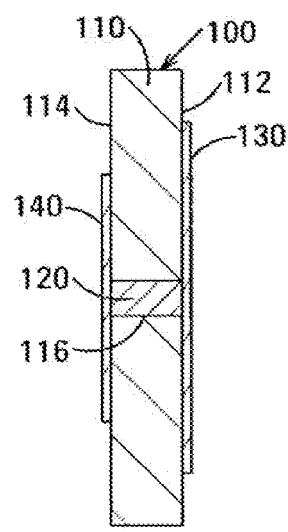
Figure 1E:
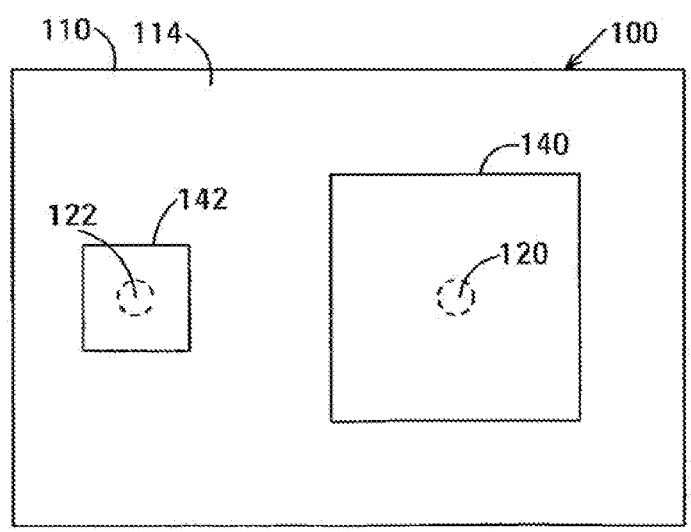
Figure 2B:
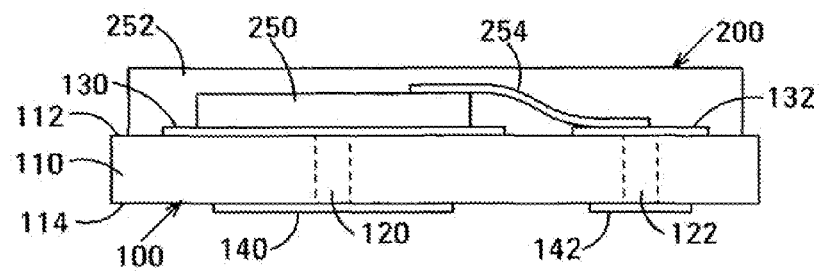
Figures 2C, 2D:
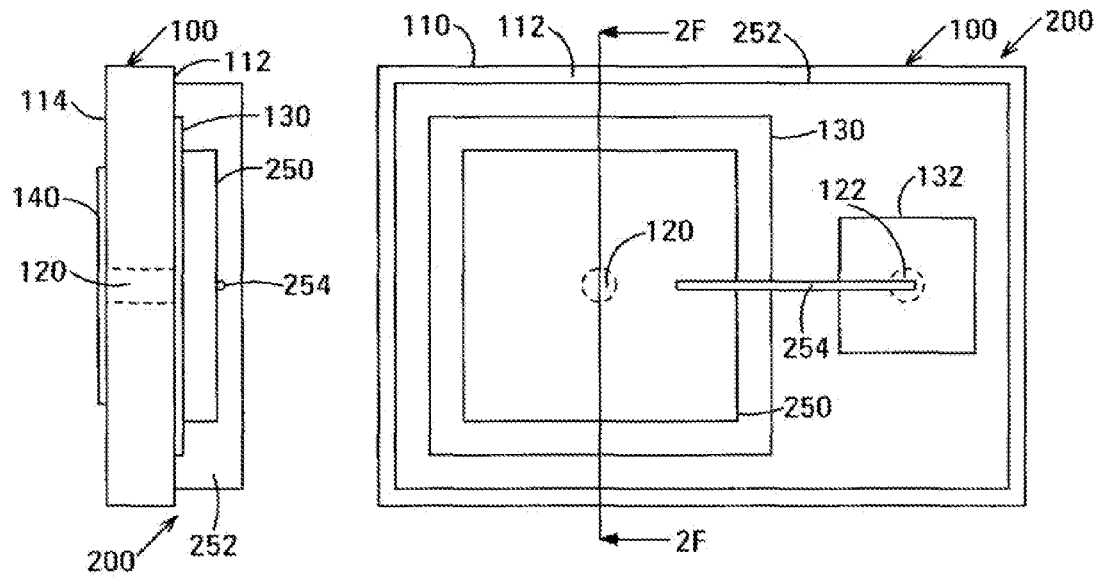
Figures 2E, 2F:
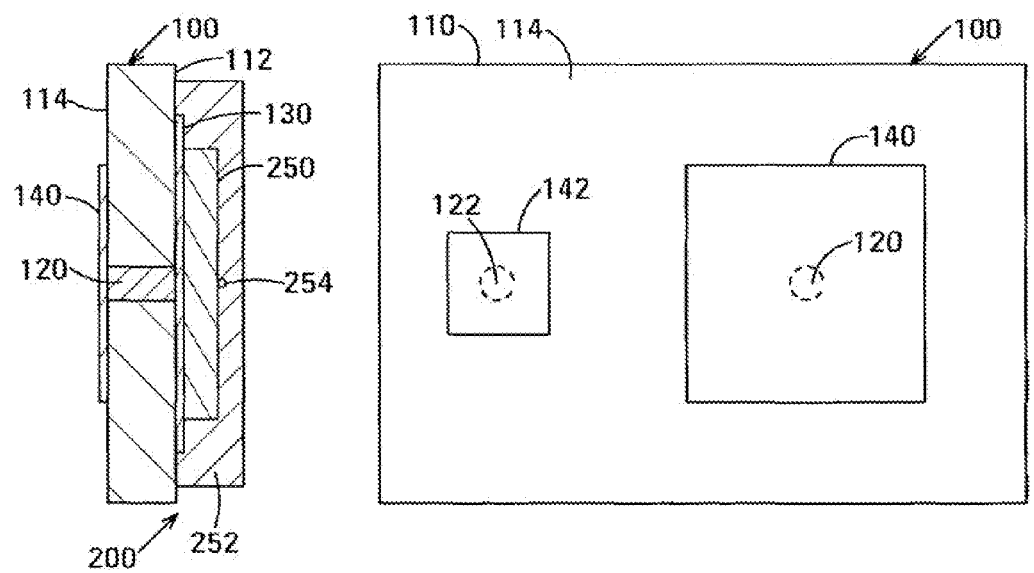

FIGS. 1A-1F are schematic diagrams illustrating a first exemplary embodiment 100 of a packaging device for a semiconductor die in accordance with the invention. Packaging device 100 is composed of a substrate 110, interconnecting elements 120 and 122, a mounting pad 130, a bonding pad 132 and connecting pads 140 and 142 (FIG. 1E).

Substrate 110 is substantially planar, has opposed major surfaces 112 and 114 and defines through holes 116 and 118 that extend through the substrate between major surfaces 112 and 114. Interconnecting element 120 is electrically conductive and is located in through hole 116. Interconnecting element 122 is electrically conductive and is located in through hole 118. Mounting pad 130 and bonding pad 132 are electrically conductive, are separate from one another and are located on the portions of the major surface 112 of substrate 110 in which through holes 116 and 118 are respectively located. Connecting pads 140 and 142 are electrically conductive, are separate from one another and are located on the portions of the major surface 114 of substrate 110 in which through holes 116 and 118 are respectively located.

Mounting pad 130 and connecting pad 140 are electrically connected to opposite ends of interconnecting element 120. Thus, interconnecting element 120 extending through substrate 110 in through hole 116 electrically connects mounting pad 130 to connecting pad 140. Bonding pad 132 and connecting pad 142 are electrically connected to opposite ends of interconnecting element 122. Thus, interconnecting element 122 extending through substrate 110 in through hole 118 electrically connects bonding pad 132 to connecting pad 142.

The material of substrate 110 is a thermally-conductive ceramic such as alumina or beryllia. In an embodiment, the material of the substrate was Kyocera.RTM. Type A440 ceramic sold by Kyocera Corp., of Kyoto, Japan. Typical dimensions of the substrate are in the range from about 0.5 mm square to about 2 mm square. Rectangular configurations are also possible. Alternative substrate materials include semiconductors, such as silicon, and epoxy laminates, such as those used in printed-circuit boards. Other materials that have a high thermal conductivity and a low electrical conductivity can be used instead of those exemplified above. The coefficient of thermal expansion of the substrate material relative to that of the semiconductor die to be mounted on packaging device 100 should also be considered in choosing the substrate material.

As will be described in more detail below, substrate 110 is part of a wafer (not shown) from which typically several hundred packaging devices 100 are fabricated by batch processing. After fabrication of the packaging devices, the wafer is singulated into individual packaging devices. Alternatively, the packaging devices may be left in wafer form after fabrication. In this case, singulation is not performed until after at least a die attach process has been performed to attach a semiconductor die to each mounting pad 130 on the wafer. In some embodiments, wafer-scale wire bonding, encapsulation and testing are also performed prior to singulation. Full electrical testing, including light output testing, may be performed on the wafer.

The material of interconnecting elements 120, 122 is metal or another electrically-conductive material. In an embodiment, the material of the interconnecting elements is tungsten, but any electrically-conductive material capable of forming a low-resistance electrical connection with the pads, i.e., mounting pad 130, bonding pad 132 and connecting pads 140, 142, and capable of withstanding the temperature of the die-attach process may be used. As noted above, packaging device 100 may be subject to a temperature as high as about 350° C. when a gold-tin eutectic is used to attach a semiconductor die to the mounting pad 130 of the packaging device. Interconnecting elements 120, 122 may be located relative to mounting pad 130 and bonding pad 132, respectively, elsewhere than the centers shown. Moreover, more than one interconnecting element may be located within either or both of the mounting pad and the bonding pad.

The material of pads 130, 132, 140, 142 is metal or another electrically-conductive material. Important considerations in selecting the material of the pads are adhesion to substrate 110, an ability to form a durable, low-resistance electrical connection with interconnecting elements 120 and 122 and an ability to withstand the temperature of the die attach process. In an embodiment, the structure of the pads is a seed layer of tungsten covered with layer of nickel about 1.2 µm to about 8.9 µm thick that is in turn covered with a layer of gold about 0.75 µm thick. Other metals, alloys, conductive materials and multi-layer structures of such materials can be used.

Packaging device 100 is used to package a semiconductor die. A semiconductor device in which a semiconductor die is packaged using packaging device 100 described above will be described next.

FIGS. 2A-2F are schematic diagrams illustrating an exemplary embodiment 200 of a semiconductor device in accordance with the invention. Semiconductor device 200 incorporates packaging device 100 in accordance with the invention. Elements of semiconductor device 200 that correspond to elements of packaging device 100 described above with reference to FIGS. 1A-1F are indicated using the same reference numerals and will not be described again in detail.

Semiconductor device 200 is composed of packaging device 100 described above with reference to FIGS. 1A-1F, a semiconductor die 250, encapsulant 252 and a bonding wire 254. In the example shown, semiconductor die 250 embodies a light-emitting diode and has anode and cathode electrodes (not shown) covering at least parts of its opposed major surfaces. Semiconductor die 250 is mounted on packaging device 100 with the metallization on its bottom major surface attached to mounting pad 130. Encapsulant 252 covers the semiconductor die and the part of the major surface 112 of substrate 100 where mounting pad 130 and bonding pad 132 are located. Bonding wire 254 extends between a bonding pad located on the top major surface of semiconductor die 250 and bonding pad 132.

The bonding pad on the top major surface of semiconductor die 250 is typically part of or connected to the anode electrode of the light-emitting diode. The metallization on the bottom major surface of semiconductor die 250 typically constitutes the cathode electrode of the light-emitting diode. Thus, the anode electrode of semiconductor die 250 is electrically connected to connecting pad 142 by bonding wire 254, bonding pad 132 and interconnecting element 122, and the cathode electrode of semiconductor die 250 is electrically connected to connecting pad 140 by mounting pad 130 and interconnecting element 120.

Encapsulant 252 has a thickness greater than the maximum height of bonding wire 254 above major surface 112. In the example shown, the encapsulant is transparent to enable semiconductor device 200 to emit the light generated by semiconductor die 250.

Semiconductor die 250 is composed of one or more layers (not shown) of any semiconductor material composed of elements from Groups II, III, IV, V and VI of the periodic table in binary, ternary, quaternary or other form. Semiconductor die 250 may additionally include a non-semiconductor substrate material, such as sapphire, metal electrode materials and dielectric insulating materials, as is known in the art.

In an embodiment of the above-described example in which semiconductor die 250 embodies a light-emitting diode, semiconductor die 250 is composed of a substrate of silicon carbide that supports one or more layers of (indium) gallium nitride. Such a light-emitting diode generates light in a wavelength range extending from ultra-violet to green. The bottom major surface (not shown) of the substrate remote from the layers of (indium) gallium nitride is coated with a metallization layer of a gold-tin alloy. A gold-tin eutectic attaches the semiconductor die to mounting pad 130, as described above, to provide a mechanical and electrical connection between the semiconductor die and the mounting pad.

The material of bonding wire 254 is gold. A process known in the art as low-loop wire bonding is used to connect the bonding wire between the anode electrode of semiconductor die 250 and bonding pad 132. Using low-loop wire bonding minimizes the maximum height of the bonding wire above substrate 110, and, therefore, reduces the overall height of semiconductor device 200. Other processes for providing an electrical connection between a bonding pad on a semiconductor die and a bonding pad on a packaging device are known in the art and may be used instead, especially in applications in which device height is a less important consideration.

The material of encapsulant 252 is clear epoxy. Alternative encapsulant materials include silicone. Embodiments of semiconductor device 200 that neither emit nor detect light can use an opaque encapsulant.

In the example of semiconductor device 200 described above, semiconductor die 250 is embodied as a light-emitting diode. Semiconductor die 250 may alternatively embody another type of diode without modification to packaging device 100. Versions of packaging device 100 may be used to package semiconductor die other than those that embody such electrical components as diodes that have only two electrodes. Versions of packaging device 100 may be used to package semiconductor die that embody such electronic circuit elements as transistors and integrated circuits that have more than two electrodes. Such versions of packaging device 100 have a number of bonding pads, interconnecting elements and connecting pads corresponding to the number of bonding pads located on the top major surface of the semiconductor die. For example, a version of packaging device 100 for packaging a semiconductor die that embodies a transistor having collector, base and emitter electrodes, and in which the substrate metallization provides the collector electrode, has two bonding pads, two interconnecting elements and two connecting pads. Wire bonds connect the emitter bonding pad on the semiconductor die to one of the bonding pads on the packaging device and the base bonding pad on the semiconductor die to the other of the bonding pads on the packaging device.

The connecting pads, e.g., connecting pads 140 and 142, of embodiments of packaging device 100 having multiple connecting pads may be arranged to conform with an industry standard pad layout to facilitate printed circuit layout. In such embodiments, the interconnecting elements may be offset from the centers of the respective mounting pads, bonding pads and connecting pads to allow the connecting pad layout to conform with such a standard pad layout. In some embodiments, one or more of the mounting pad, bonding pads and connecting pads may have a shape that differs from the regular shapes illustrated. Some irregular shapes include two main regions electrically connected by a narrow track. For example, an irregularly-shaped bonding pad includes a region to which the bonding wire is attached, a region connected to the interconnecting element and a narrow track interconnecting the two regions.

Some versions of packaging device may accommodate two or more semiconductor die. In such versions, mounting pad 130 is sized large enough to accommodate the two or more semiconductor die. Additionally, such versions include sufficient bonding pads, interconnecting elements and connecting pads to make the required number of electrical connections to the semiconductor die. Alternatively, the packaging device may include two or more mounting pads. The mounting pads may be electrically connected to one another and thence to a common interconnecting element and connecting pad. Alternatively, each mounting pad may be electrically connected to a corresponding connecting pad by a respective interconnecting element.

Semiconductor device 200 is used by mounting it on a printed circuit board or other substrate using conventional surface-mount techniques or other techniques known in the art. Semiconductor device 200 is placed on a surface of the printed circuit board with connecting pads 140 and 142 aligned with respective pads on the printed circuit board. The printed circuit board is then passed across a solder wave to form a solder joint between connecting pads 140 and 142 and the respective pads on the printed circuit board. Alternatively, semiconductor device 200 may be affixed to a printed circuit board by a process known as infra-red reflow soldering in which a pattern of solder is applied to the printed circuit board using a stencil, semiconductor device 200 and, optionally, other components are loaded onto the printed circuit board and the printed circuit board assembly is irradiated with infra-red light to heat and reflow the solder. Other processes for attaching electronic components to printed circuit boards are known in the art and may alternatively be used. Packaging device 100 and semiconductor device 200 may additionally include adhesive regions on the major surface 114 of substrate 110 external to connecting pads 140 and 142 to hold the semiconductor device in place on the printed circuit board during soldering.

In semiconductor device 200, packaging device 100 and encapsulant 252 collectively have a volume that is only about 15 times the volume of semiconductor die 250. Thus, packaging device 100 is well suited for use in high packing density applications. Moreover, packaging device 100 is fabricated from materials capable of withstanding the high temperatures involved in a die attach process that uses a gold-tin eutectic. Accordingly, packaging device 100 is well suited for packaging semiconductor die, such as the die of certain light-emitting devices, that require a die attach process that uses a gold-tin eutectic.

As noted above, many printed circuit board assembly processes are designed to use standard device packages, but many standard device packages are incapable of withstanding the high temperatures involved in a die attach process that uses a gold-tin eutectic. FIGS. 3A-3F are schematic drawings showing a second embodiment 300 of a packaging device in accordance with the invention. Packaging device 300 takes the form of a submount that enables semiconductor die that are mounted using a gold-tin eutectic or other high-temperature die attach process to be mounted in conventional semiconductor device packages that are incapable of withstanding such high temperatures. Moreover, packaging device 300 with a semiconductor die mounted thereon can be mounted in a conventional semiconductor device package as if it were a conventional semiconductor die. This allows conventional die attach, wire bond and encapsulation processes to be used to assemble the final semiconductor device that incorporates the submount.

Figure 3A:
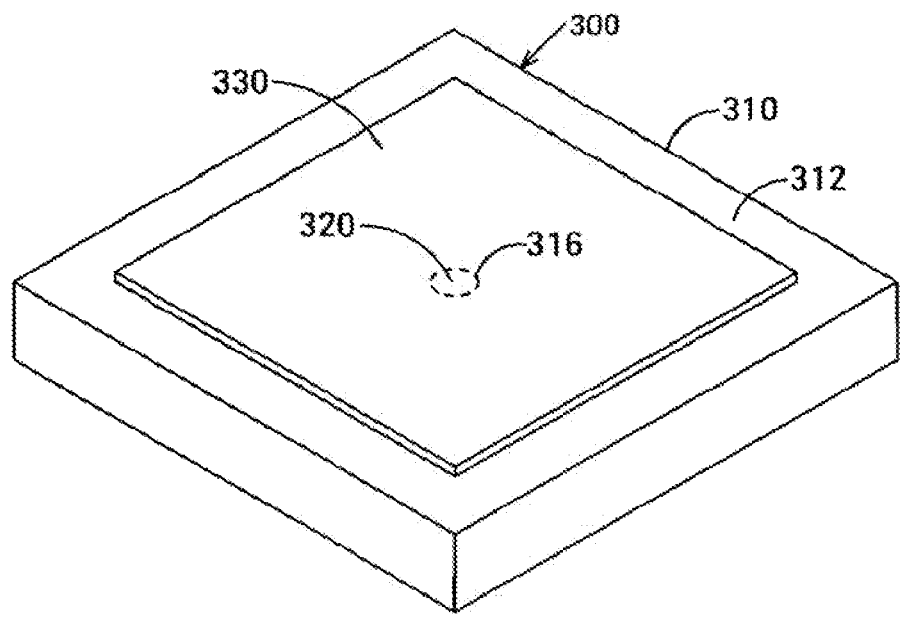
Figure 4A:
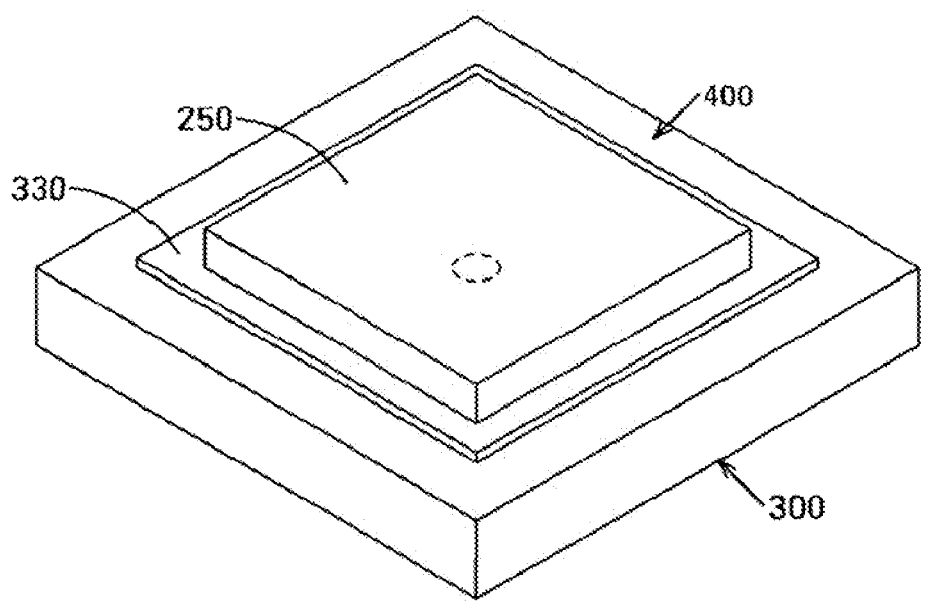
FIGS. 4A, 4B, 4C, 4D, 4E and 4F are respectively an isometric view, a side view, a front view, a top view, a bottom view and a cross-sectional view of a second embodiment of a semiconductor device in accordance with the invention. The cross-sectional view of FIG. 4F is along the section line 4F-4F in FIG. 4D.
Figure 4B:
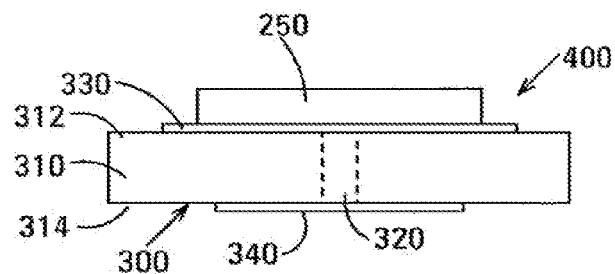
Figure 4C:
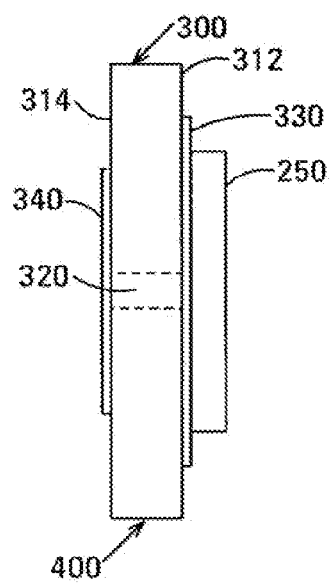
Figure 4D:
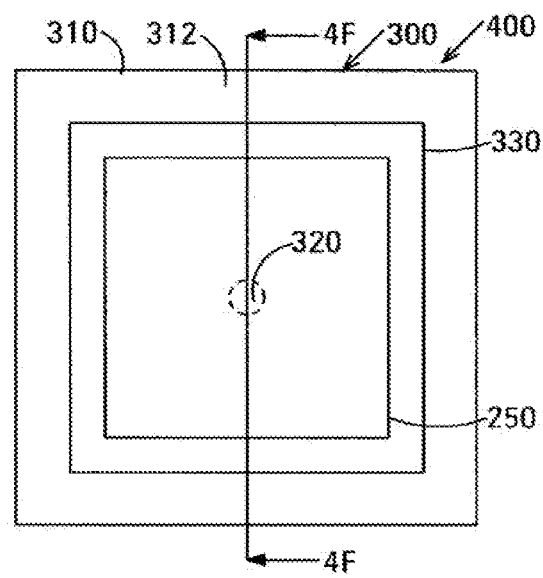
Figure 4F:
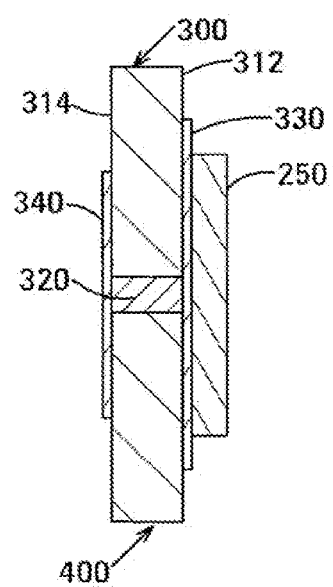
Figure 4E:
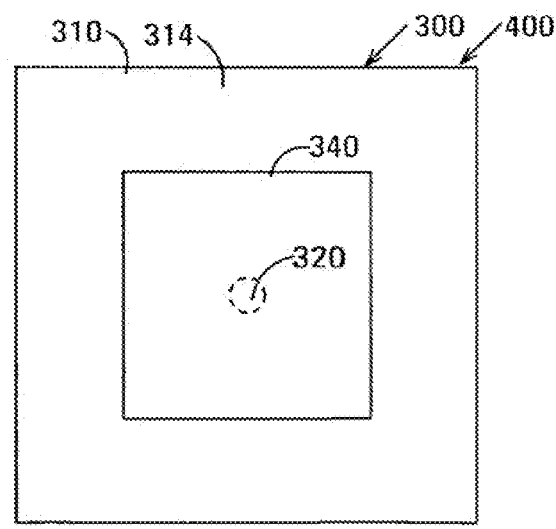

FIGS. 3A-3F are schematic diagrams illustrating a second exemplary embodiment 300 of a packaging device for a semiconductor die in accordance with the invention. Packaging device 300 takes the form of a submount for a semiconductor die. Packaging device 300 is composed of a substrate 310, an interconnecting element 320, a mounting pad 330 and a connecting pad 340 (FIG. 3E).

Substrate 310 is substantially planar, has opposed major surfaces 312 and 314 and defines a through hole 316 that extends through the substrate between major surfaces 312 and 314. Interconnecting element 320 is electrically conductive and is located in through hole 316. Mounting pad 330 is electrically conductive and is located on a portion of the major surface 312 of substrate 310 in which through hole 316 is located. Alternatively, mounting pad 330 may cover major surface 312. Connecting pad 340 is electrically conductive and is located on a portion of the major surface 314 of the substrate in which through hole 316 is located. Alternatively, connecting pad 340 may cover major surface 314.

Mounting pad 330 and connecting pad 340 are electrically connected to opposite ends of interconnecting element 320. Thus, interconnecting element 320 extending through the substrate in through hole 316 electrically connects mounting pad 330 to connecting pad 340.

Materials and other details of substrate 310, interconnecting element 320, mounting pad 330 and connecting pad 340 are the same as those of substrate 110, interconnecting element 120, mounting pad 130 and connecting pad 140, respectively, of packaging device 100 described above with reference to FIGS. 1A-1F and will therefore not be described again here.

A semiconductor device in which a semiconductor die is packaged using packaging device 300 described above will be described next.

FIGS. 4A-4F are schematic diagrams illustrating an exemplary embodiment 400 of a semiconductor device in accordance with the invention. Semiconductor device 400 incorporates packaging device 300 in accordance with the invention. Elements of semiconductor device 400 that correspond to elements of semiconductor device 200 described above with reference to FIGS. 2A-2F and of packaging device 300 described above with reference to FIGS. 3A-3F are indicated using the same reference numerals and will not be described again in detail.

Semiconductor device 400 is composed of a semiconductor die 250 mounted on packaging device 300 described above with reference to FIGS. 3A-3F. In the example shown, semiconductor die 250 embodies a light-emitting diode and has anode and cathode electrodes (not shown) covering at least parts of its opposed major surfaces. Specifically, semiconductor die 250 is mounted on packaging device 300 with the metallization on its bottom major surface attached to mounting pad 330. The metallization on the bottom major surface of semiconductor die 250 typically constitutes the cathode electrode of the light-emitting diode. Thus, the cathode electrode of semiconductor die 250 is electrically connected to connecting pad 340 by mounting pad 330 and interconnecting element 320. The top major surface of semiconductor die 250 typically includes a bonding pad that is typically part of or connected to the anode electrode of the light-emitting diode. This bonding pad remains exposed for later connection to the conventional semiconductor packaging device in which semiconductor device 400 will later be mounted.

Semiconductor device 400 is used by mounting it on a conventional semiconductor packaging device (not shown), such as the lead frame of a plastic package. Specifically, semiconductor device 400 is mounted on the lead frame with connecting pad 340 attached to a conductive mounting surface of the lead frame. Connecting pad 340 is attached to the mounting surface of the lead frame using a low-temperature die attach process, such as one that uses silver epoxy. Thus, semiconductor device 400 is compatible with conventional semiconductor device assembly processes. One or more bonding wires (not shown) are connected between bonding pads on the exposed major surface of semiconductor die 250 and the bonding pads of the lead frame. The lead frame with semiconductor device 400 mounted thereon is then encapsulated to complete the fabrication of the semiconductor device.

Semiconductor device 400 may be mounted on or in conventional semiconductor packaging devices other that the lead frame based packaging device just exemplified.

Semiconductor device 400 is also suitable for attaching directly to a printed circuit board. A conventional die attach process can be used to attach connecting pad 340 directly to a suitably-sized pad on the printed circuit board. Such a die attach process does not subject the printed circuit board to the high temperatures that were used to attach semiconductor die 250 to the mounting pad 330 of packaging device 300.

A fabrication method in accordance with the invention will now be described. The fabrication method can be used to fabricate the packaging devices described above with reference to FIGS. 1A-1F and 3A-3F. In the method, a substrate is provided. The substrate is substantially planar, has opposed major surfaces, and includes a through hole extending between the major surfaces. The through hole is filled with a conductive interconnecting element. A conductive mounting pad and a conductive connecting pad are formed on different ones of the major surfaces in electrical contact with the conductive interconnecting element.

The fabrication method will now be described in further detail with reference to FIGS. 5A-5C, which show a highly simplified example of the method in which two packaging devices similar to packaging device 100 described above with reference to FIGS. 1A-1F are fabricated in a wafer. As noted above, hundreds of packaging devices are typically fabricated simultaneously in a single wafer of substrate material.

Figure 5A:
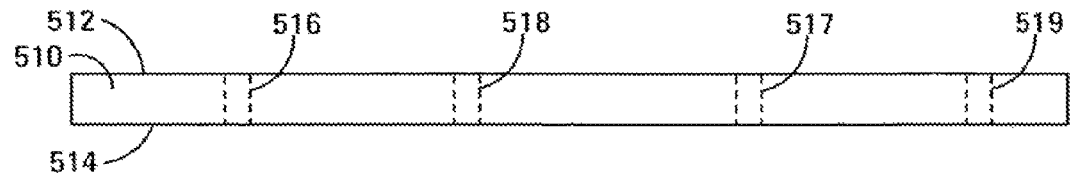
FIGS. 5A-5C are side views illustrating a method in accordance with the invention for fabricating a packaging device for a semiconductor die.

FIG. 5A shows a wafer 510 of substrate material. A portion of the wafer constitutes the substrate of each of the packaging devices that will be fabricated in the wafer. Wafer 510 has opposed major surfaces 512 and 514. Portions of major surfaces 512 and 514 constitute the major surfaces of each of the packaging devices that will be fabricated in the wafer. The material of wafer 510 is one of the substrate materials described above.

Defined in wafer 510 is at least one through hole for each of the packaging devices that will be fabricated in the wafer. A packaging device similar to packaging device 300 described above with reference to FIGS. 3A-3F has one through hole per packaging device. In the example shown in FIG. 5A, each packaging device is similar to packaging device 100 described above with reference to FIGS. 1A-1F and has two through holes per packaging device. Through holes 516 and 518 of one of the packaging devices and through holes 517 and 519 of the other of the packaging devices are shown.

In an embodiment, through holes 516-519 are formed by punching. The through holes may alternatively be formed by drilling or laser ablation. Many other ways suitable for forming holes having a diameter in a range from about 100 µm to about 2 mm are known in the art and may be used instead.

Figure 5B:
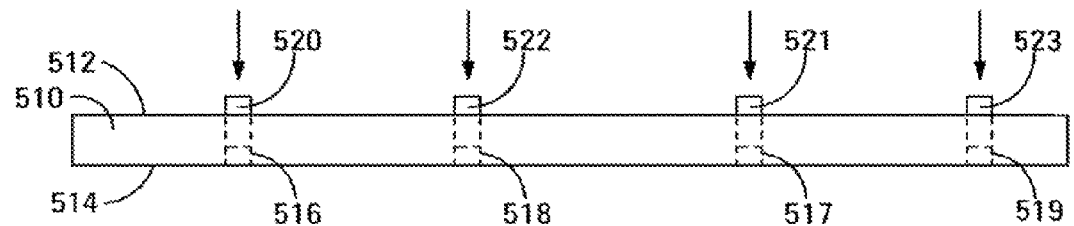

FIG. 5B shows interconnecting elements 520-523 being introduced into through holes 516-519, respectively, to fill the through holes. Interconnecting elements 520-523 are slugs of conductive material having a diameter smaller than the diameter of the through holes and a length larger than the thickness of wafer 510. In an embodiment, the material of the interconnecting elements is tungsten. A squeezing process is used to fill the through holes with the interconnecting elements. The squeezing process introduces the interconnecting elements into the through holes and then reduces the length and increases the diameter of the interconnecting elements. The squeezing process leaves the ends of the interconnecting elements approximately flush with respective major surfaces 512 and 514, and the interconnecting elements retained in the through holes by friction. An adhesive may additionally or alternatively be used to retain the interconnecting elements in the through holes.

The through hole may be filled with the interconnecting element in other ways. For example, through-hole plating may be used. In other alternatives, screen printing or metal deposition are used. A through hole will be regarded as having been filled with an interconnecting element even when the interconnecting element occupies only part of the volume of the through hole.

Figure 5C:
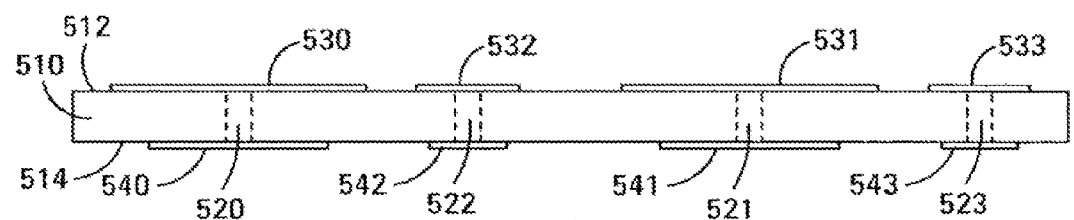

FIG. 5C shows mounting pad 530 and connecting pad 540 formed on major surfaces 512 and 514, respectively, of wafer 510 in electrical contact with the opposite ends of interconnecting element 520. FIG. 5C additionally shows mounting pad 531 and connecting pad 541 formed on major surfaces 512 and 514, respectively, in electrical contact with interconnecting element 521, bonding pad 532 and connecting pad 542 formed on major surfaces 512 and 514, respectively, in electrical contact with interconnecting element 522, and bonding pad 533 and connecting pad 543 formed on major surfaces 512 and 514, respectively, in electrical contact with interconnecting element 523.

Conductive pads 530-533 and 540-543 are formed on wafer 510 by electro less plating using a screen printed mask. A photo mask may alternatively be used. Examples of other selective processes that may be used to form pads 530-533 and 540-543 are electroplating, screen printing and metal deposition. In another embodiment, major surfaces 512 and 514 are each initially covered with a layer of metal using a cladding process. The layer of metal may take the form a metal foil pressed into contact with the respective major surface to cause the foil to adhere to the wafer. An adhesive may be used to increase adhesion. Portions of the layer of metal are then selectively removed to define pads 530-533 and 540-543. A mask and etch process may be used to perform the selective removal.

Figure 5D:
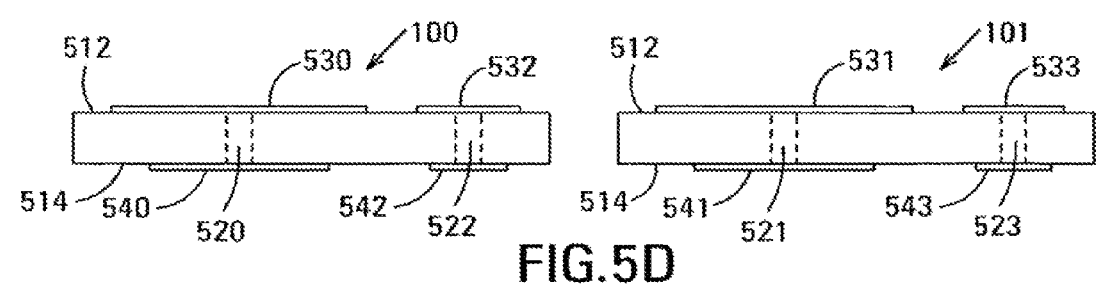
FIG. 5D is a side view illustrating an optional additional process that may be included in the method illustrated in FIGS. 5A-5C.

Packaging devices in accordance with the invention are typically supplied to users in the wafer state shown in FIG. 5C so that they can be used in wafer-scale assembly processes. However, the packaging devices can alternatively be supplied singly. FIG. 5D shows an optional additional element of the above-described fabrication method in which wafer 510 is singulated into individual packaging devices 100 and 101. Singulation may be performed by sawing, scribing and breaking or by another singulation process.

In a practical embodiment of the above-described method, through holes 516-519 are formed in wafer 510 (FIG. 5A), the through holes are filled with interconnecting elements 520-523 (FIG. 5B) and regions of tungsten, each of which constitutes a seed layer for one of the conductive pads 530-533 and 540-543, are screen printed on the wafer with the wafer in its "green", i.e., unfired state. The wafer is then fired. After the wafer has been fired, an electroless plating process is performed to deposit one or more additional layers of metal to complete the formation of conductive pads 530-533 and 540-543 (FIG. 5C).

A method in accordance with the invention for fabricating a semiconductor device using the wafer-scale device packages shown in FIG. 5C will now be described. The method can be used to fabricate the semiconductor devices described above with reference to FIGS. 2A-2F. Portions of the method can be used to fabricate the semiconductor devices illustrated in FIGS. 4A-4F. In the method, a semiconductor die is mounted on the mounting pad of the packaging device, a bonding wire is connected between the semiconductor die and the bonding pad of the packaging device, and the semiconductor die and at least a portion of the major surface of the packaging device on which the mounting pad is located are encapsulated.

The fabrication method will now be described in further detail with reference FIGS. 6A-6D, which show a highly simplified example in which two semiconductor devices similar to semiconductor device 200 described above with reference to FIGS. 2A-2F are fabricated. As noted above, hundreds of semiconductor devices are typically fabricated simultaneously on a single wafer.

Figure 6A:
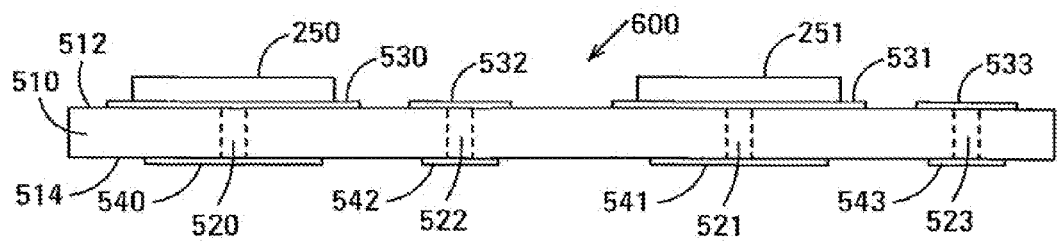
FIGS. 6A-6D are side views illustrating a method in accordance with the invention for fabricating a semiconductor device.

FIG. 6A shows a wafer-scale array 600 of packaging devices supplied in wafer-scale form on wafer 510. Semiconductor device 250 is mounted on mounting pad 530 and a semiconductor device 251 is mounted on mounting pad 531. In an embodiment, a semiconductor die having a gold-tin metallization on its bottom major surface is placed on each mounting pad 530, 531 on wafer 510. The wafer is then heated to a temperature in the range from about 280° C. to about 350° C. for a time in the range from about one second to about 60 seconds. The gold-tin eutectic that forms attaches the semiconductor die to the respective mounting pad when the wafer is allowed to cool.

Other die attach processes, including die attach processes that require substantially lower peak temperatures, are known in the art and may be used instead of the die attach process just described. Not all die attach processes are suitable for use with all die metallizations, however.

Figure 6B:
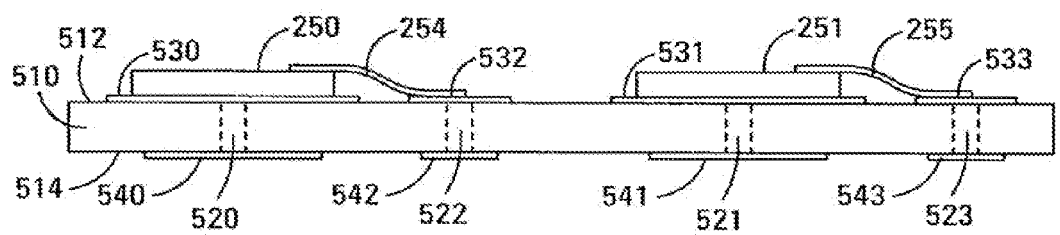

FIG. 6B shows a bonding wire 254 connected between a bonding pad (not shown) on the exposed major surface of semiconductor die 250 and bonding pad 532 and a bonding wire 255 connected between a bonding pad (not shown) on the exposed major surface of semiconductor die 251 and bonding pad 533.

In an embodiment, low loop wire bonding is used to connect bonding wires 254, 255 between semiconductor die 250, 251 and bonding pads 532, 533. Other ways to electrically connect a bonding pad located on the exposed surface of a semiconductor die to a bonding pad similar to bonding pads 532, 533 are known the art and can alternatively be used.

Figure 6C:
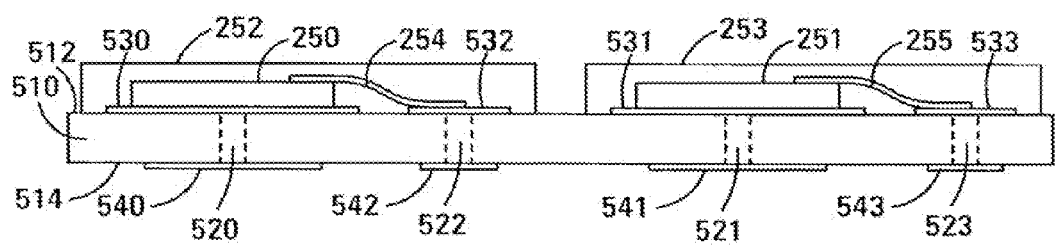

FIG. 6C shows semiconductor die 250 and a portion of major surface 512 on which mounting pad 530 is located encapsulated by encapsulation 252, and semiconductor die 251 and a portion of major surface 512 on which mounting pad 531 is located encapsulated by encapsulation 253.

In an embodiment, the encapsulant is clear epoxy. Silicone is another suitable encapsulant. Other encapsulants are known in the art and may be used where appropriate. In an embodiment, the encapsulant was applied by transfer molding. Other application processes are known in the art and may be used where appropriate. Examples of other suitable application processes include injection molding, casting and dam and fill.

Figure 6D:
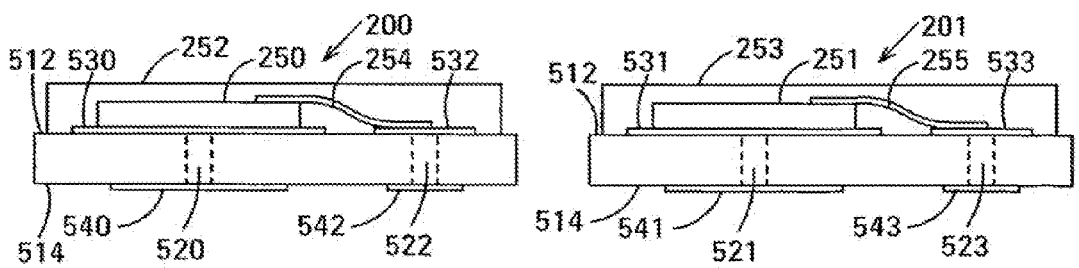

FIG. 6D shows wafer 510 after it has been singulated into individual semiconductor devices 200 and 201. Singulation may be performed by sawing, scribing and breaking or by another suitable singulation process. The semiconductor devices fabricated on wafer 510 may be electrically tested before the wafer is singulated. The ability to test the semiconductor devices at the wafer scale level substantially reduces the cost of testing.

The processes illustrated in FIGS. 6B and 6C are omitted when the method illustrated in FIGS. 6A-6D is used to fabricate a submount semiconductor device similar to that described above with reference to FIGS. 4A-4F.

Figure 7A:
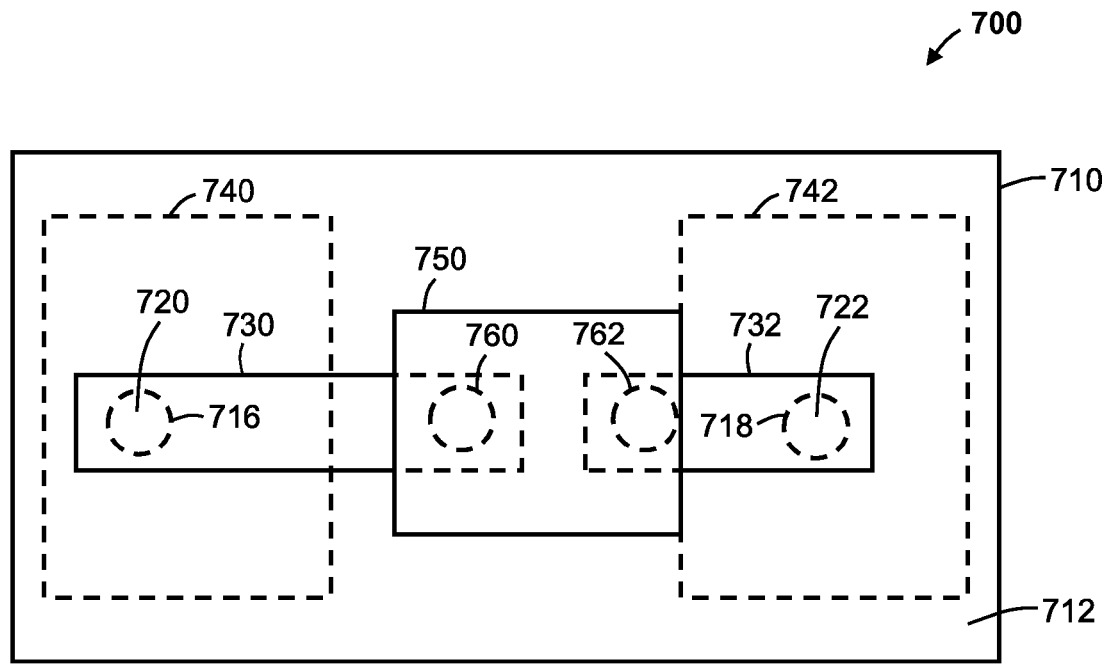
FIGS. 7A and 7B are respectively a top view and a side view of a semiconductor device in accordance with another embodiment of the invention.
Figure 7B:
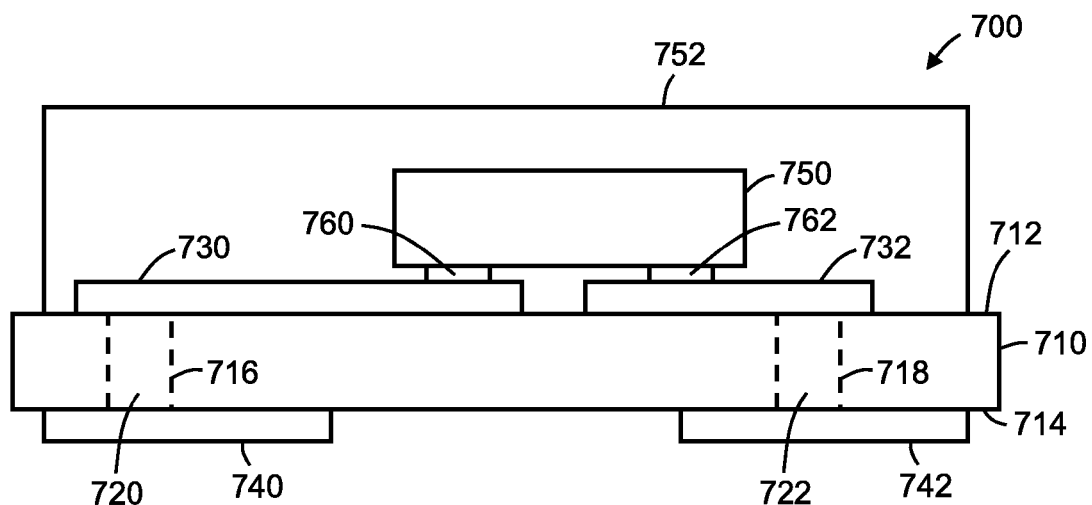

Turning now to FIGS. 7A and 7B, a semiconductor device 700 in accordance with another embodiment of the invention is shown. FIG. 7A is a top view of the semiconductor device 700, while FIG. 7B is a side view of the semiconductor device 700. The semiconductor device 700 is similar to the semiconductor device 200. However, the semiconductor device 700 does not use any bonding wire, such as the bonding wire 254 of the semiconductor device 200.

As shown in FIGS. 7A and 7B, the semiconductor device 700 includes a substrate 710, interconnecting elements 720 and 722, bonding pads 730 and 732, connecting pads 740 and 742, and a semiconductor die 750. The substrate 710 is identical to the substrate 110 of the semiconductor device 200. Also, the interconnecting elements 720 and 722 are identical to the interconnecting elements 120 and 122 of the semiconductor device 200. The interconnecting elements 720 and 722 are located in through holes 716 and 718 of the substrate 710. The interconnecting elements 720 and 722 can be made of the same material as the interconnecting elements 120 and 122 of the semiconductor device 200.

The bonding pads 730 and 732 are similar to the mounting pad 130 and the bonding pad 132 of the semiconductor device 200. The bonding pads 730 and 732 are located on an upper major surface 712 of the substrate 710. However, as illustrated in FIG. 7A, the shapes of the bonding pads 730 and 732 differ from those of the mounting pad 130 and the bonding pad 132 of the semiconductor device 200. In particular, in the illustrated embodiment, the bonding pads 730 and 732 are rectangular in shape. However, in other embodiments, the bonding pads 730 and 732 may be configured in other shapes. Likewise, the connecting pads 740 and 742 are similar to the connecting pads 140 and 142 of the semiconductor device 200. The connecting pad 740 and 742 are located on a lower major surface 714 of the substrate 710. These pads of the semiconductor device 700 can be made of the same material as the pads of the semiconductor device 200.

In this embodiment, the semiconductor die 750 is a die with bond pads 760 and 762 on a lower major surface of the die, which is the surface that faces the substrate 710 when the die is mounted on the substrate. In an embodiment the semiconductor die 750 is a light emitting diode (LED) die. In this embodiment, the bond pads 760 and 762 are connected to the anode and the cathode of the LED die, which are located on the bottom major surface of the LED die. Thus, the bond pads 760 and 762 can be considered as the anode and cathode bond pads, respectively, or vice versa. However, in other embodiments, the semiconductor die 750 may be a different type of a light emitting semiconductor die, such as a laser diode.

In the illustrated embodiment, the semiconductor die 750 is mounted on the substrate 710 using flip chip technology. Specifically, the semiconductor die 750 is mounted on the bonding pads 730 and 732 such that the bond pad 760 is attached to the bonding pad 730 and the bond pad 762 is attached to the bonding pad 732. As an example, the bond pads 760 and 762 may be attached to the bonding pads 730 and 732, respectively, using solder bumps or other electrically conductive and adhesive material. Consequently, the bond pad 760 of the semiconductor die 750 is electrically connected to the connecting pad 740 via the bonding pad 730 and the interconnecting element 720, and the bond pad 762 of the semiconductor die 750 is electrically connected to the connecting pad 742 via the bonding pad 732 and the interconnecting element 722. Thus, in this embodiment, no bonding wire is used to electrically connect the semiconductor die 750 to any of the bonding pads 730 and 732.

In some embodiments, the semiconductor die 750 of the semiconductor device 700 may be encapsulated by an encapsulant 752 (only illustrated in FIG. 7B), which can be identical to the encapsulant 152 of the semiconductor device 200.

Figure 8A:
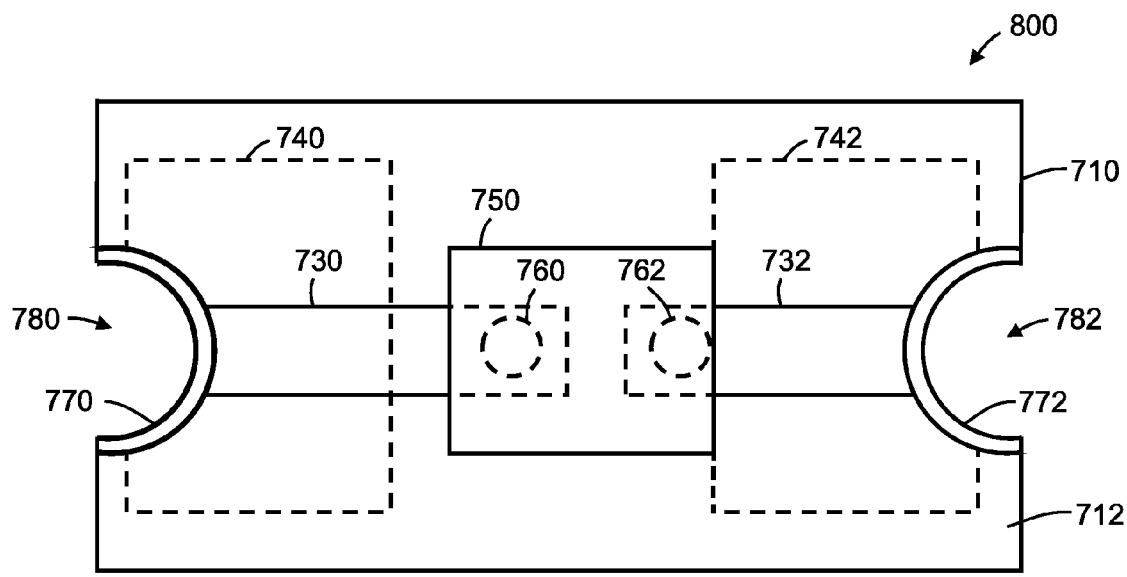
FIGS. 8A, 8B and 8C are respectively a top view and different side views of a semiconductor device in accordance with another embodiment of the invention.
Figure 8B:
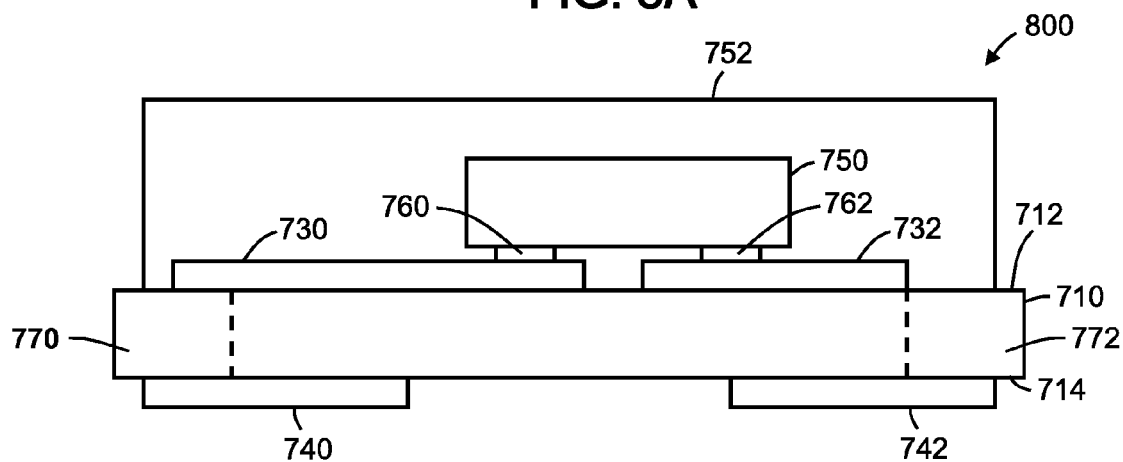
Figure 8C:
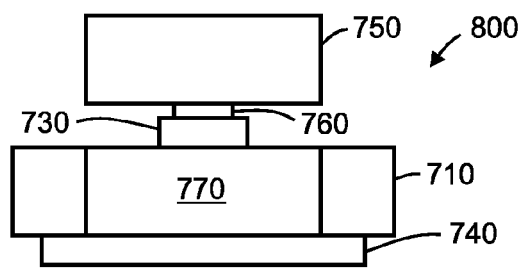

Turning now to FIGS. 8A, 8B and 8C, a semiconductor device 800 in accordance with another embodiment of the invention is shown. FIG. 8A is a top view of the semiconductor device 800, while FIGS. 8B and 8C are different side views of the semiconductor device 800. The semiconductor device 800 is similar to the semiconductor device 700. Thus, the reference numbers of FIGS. 7A and 7B will be used in FIGS. 8A-8C to indicate similar elements.

As shown in FIGS. 8A-8C, the semiconductor device 800 includes the substrate 710, the bonding pads 730 and 732, the connecting pads 740 and 742, and the semiconductor die 750. However, the semiconductor device 800 does not include the interconnecting elements 720 and 722, which electrically connect the bonding pads 730 and 732 to the connecting pads 740 and 742, respectively, through the substrate 710 via the through holes 716 and 718. In this embodiment, the bonding pads 730 and 732 are electrically connected to the connecting pads 740 and 742 via edge interconnecting elements 770 and 772, as illustrated in FIG. 8C, which is a side view of the semiconductor device 800 showing the edge interconnecting element 770. The edge interconnecting elements 770 and 772 are located on sidewalls of the substrate 710. In the illustrated embodiment, the edge interconnecting elements 770 and 772 are located on opposed sidewalls of the substrate 710. However, in other embodiments, the edge interconnecting elements 770 and 772 may be located on different sidewalls of the substrate 710, or even on the same sidewall. The edge interconnecting elements 770 and 772 can be made of the same material as the interconnecting elements 120 and 122 of the semiconductor device 200.

In an embodiment, as illustrated in FIG. 8A, the edge interconnecting elements 770 and 772 are attached to their respective sidewalls within partial cylindrical depressions 780 and 782, respectively. The partial cylindrical depressions 780 and 782 are created by forming circular holes through the substrate 710 connecting the upper and lower major surfaces 712 and 714 of the substrate 710. The circular holes are then coated or filled with appropriate material for the edge interconnecting elements 770 and 772. When the semiconductor device 800 is separated from other semiconductor devices on a wafer, these circular holes are cut in half, which forms the partial cylindrical depressions 780 and 782 on the sidewalls of the substrate 710, as well as the edge interconnecting elements 770 and 772 within the partial cylindrical depressions 780 and 782. Thus, in this embodiment, the semiconductor device 800 does not use interconnecting elements that extend through the substrate 710 to electrically connect the bonding pads 730 and 732 to the connecting pads 740 and 742.

In some embodiments, the semiconductor die 750 of the semiconductor device 800 may be encapsulated by an encapsulant 752 (only illustrated in FIG. 8B), which can be identical to the encapsulant 152 of the semiconductor device 200.

Edge interconnecting elements, such as the edge interconnecting elements 770 and 772 of the semiconductor device 800, may also be used in other semiconductor devices to electrically connect pads on opposed substrate surfaces of the devices. As an example, edge interconnecting elements may be used in the semiconductor device 200 to electrically connect the mounting pad 130 and the bonding pad 132 to the connecting pads 140 and 142, respectively. In this example, the interconnecting elements 120 and 122 located in the through holes 116 and 118, respectively, will no longer be needed to electrically connect the mounting pad 130 and the bonding pad 132 to the connecting pads 140 and 142, respectively.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A semiconductor device comprising:
a substantially planar substrate having first and second major surfaces, the first and second major surfaces being opposed surfaces;
a light emitting semiconductor die comprising a top major light emitting surface and an oppositely-disposed bottom major surface, the light emitting semiconductor die having an anode and a cathode on the bottom major surface of the light emitting semiconductor die, the anode and the cathode of the light emitting semiconductor die being electrically connected to first and second electrically conductive bonding pads located on the first major surface, the semiconductor light emitting die being mounted on at least the first electrically conductive bonding pad such that one of the anode and the cathode on the bottom major surface of the light emitting semiconductor die is electrically connected to the first electrically conductive bonding pad;
first and second electrically conductive connecting pads located on the second major surface;
a first electrically conductive interconnecting element electrically connected to the first electrically conductive bonding pad and the first electrically conductive connecting pad; and
a second electrically conductive interconnecting element electrically connected to the second electrically conductive bonding pad and the second electrically conductive connecting pad,
wherein the bottom major surface of the light emitting semiconductor die is a bottom surface of a substrate of the die, each of the anode and cathode comprises a metallization layer formed on the bottom major surface of the light emitting semiconductor die.

2. The semiconductor device of claim 1 wherein at least one of the first and second electrically conductive interconnecting elements is on at least one sidewall of the substantially planar substrate and electrically interconnects one of the first and second electrically conductive bonding pads to one of the first and second electrically conductive connecting pads.

3. The semiconductor device of claim 2 wherein the first electrically conductive interconnecting element is on a sidewall of the substantially planar substrate and electrically interconnects the first electrically conductive bonding pad to the first electrically conductive connecting pad and the second electrically conductive interconnecting element is on the same sidewall or another sidewall of the substantially planar substrate and electrically interconnects the second electrically conductive bonding pad to the second electrically conductive connecting pad.

4. The semiconductor device of claim 2 wherein the at least one of the first and second electrically conductive interconnecting elements is situated within a partial cylindrical depression in the at least one sidewall of the substantially planar substrate.

5. The semiconductor device of claim 1, wherein the light emitting semiconductor die is also mounted on the second electrically conductive bonding pad such that the anode and the cathode of the light emitting semiconductor die, are electrically connected to the first and second electrically conductive bonding pads, respectively.

6. The semiconductor device of claim 1 wherein the light emitting semiconductor die is a light emitting diode die.

7. A semiconductor device comprising:
a substantially planar substrate having first and second major surfaces, the first and second major surfaces being opposed surfaces;
first and second electrically conductive bonding pads located on the first major surface;
a light emitting semiconductor die comprising a top major light emitting surface and an oppositely-disposed bottom major surface, the light emitting semiconductor die having an anode and a cathode on the bottom major surface of the light emitting semiconductor die, the semiconductor light emitting die being mounted on the first and second electrically conductive bonding pads such that the anode of the light emitting semiconductor die is electrically connected to the first electrically conductive bonding pad and the cathode of the light emitting semiconductor die is electrically connected to the second electrically conductive bonding pad;
first and second electrically conductive connecting pads located on the second major surface;
a first electrically conductive interconnecting element electrically connected to the first electrically conductive bonding pad and the first electrically conductive connecting pad; and
a second electrically conductive interconnecting element electrically connected to the second electrically conductive bonding pad and the second electrically conductive connecting pad,
wherein the bottom major surface of the light emitting semiconductor die is a bottom surface of a substrate of the die, each of the anode and cathode comprises a metallization layer formed on the bottom major surface of the light emitting semiconductor die.

8. The semiconductor device of claim 7 wherein at least one of the first and second electrically conductive interconnecting elements is on at least one sidewall of the substantially planar substrate and electrically interconnects one of the first and second electrically conductive bonding pads to one of the first and second electrically conductive connecting pads.

9. The semiconductor device of claim 8 wherein the first electrically conductive interconnecting element is on a sidewall of the substantially planar substrate and electrically interconnects the first electrically conductive bonding pad to the first electrically conductive connecting pad and the second electrically conductive interconnecting element is on the same sidewall or another sidewall of the substantially planar substrate and electrically interconnects the second electrically conductive bonding pad to the second electrically conductive connecting pad.

10. The semiconductor device of claim 8 wherein the at least one of the first and second electrically conductive interconnecting elements is situated within a partial cylindrical depression in the at least one sidewall of the substantially planar substrate.

11. A semiconductor device comprising:
a substantially planar substrate having first and second major surfaces, the first and second major surfaces being opposed surfaces;
first and second electrically conductive bonding pads located on the first major surface;
a light emitting semiconductor die comprising a top major light emitting surface and an oppositely-disposed bottom major surface, the light emitting semiconductor die having an anode and a cathode on the bottom major surface of the light emitting semiconductor die, the anode and the cathode of the light emitting semiconductor die being electrically connected to the first and second electrically conductive bonding pads, the semiconductor light emitting die being mounted on at least the first electrically conductive bonding pad such that one of the anode and the cathode on the bottom major surface of the light emitting semiconductor die is electrically connected to the first electrically conductive bonding pad;
first and second electrically conductive connecting pads located on the second major surface;
a first electrically conductive interconnecting element electrically connected to the first electrically conductive bonding pad and the first electrically conductive connecting pad; and
a second electrically conductive interconnecting element electrically connected to the second electrically conductive bonding pad and the second electrically conductive connecting pad, wherein at least one of the first and second electrically conductive interconnecting elements is located on at least one sidewall of the substantially planar substrate,
wherein the bottom major surface of the light emitting semiconductor die is a bottom surface of a substrate of the die, each of the anode and cathode comprises a metallization layer formed on the bottom major surface of the light emitting semiconductor die.

12. The semiconductor device of claim 11 wherein the first electrically conductive interconnecting element is on a sidewall of the substantially planar substrate and electrically interconnects the first electrically conductive bonding pad to the first electrically conductive connecting pad and the second electrically conductive interconnecting element is on the same sidewall or another sidewall of the substantially planar substrate and electrically interconnects the second electrically conductive bonding pad to the second electrically conductive connecting pad.

13. The semiconductor device of claim 11 wherein the at least one of the first and second electrically conductive interconnecting elements is situated within a partial cylindrical depression in the at least one sidewall of the substantially planar substrate.

14. The semiconductor device of claim 11, wherein the light emitting semiconductor die is also mounted on the second electrically conductive bonding pad such that the anode and the cathode of the light emitting semiconductor die are electrically connected to the first and second electrically conductive bonding pads, respectively.

* * * * *